(12) United States Patent
Milton et al.

(10) Patent No.: US 8,472,580 B2
(45) Date of Patent: Jun. 25, 2013

(54) CLOCK RECOVERY

(75) Inventors: Jonathan Paul Milton, St. Albans (GB);
Richard Simpson, Carlton (GB);
Eugenia Carr Cordero Crespo,
Bedford (GB)

(73) Assignee: Texas Instruments Incorporated,
Dallas, TX (US)

( * ) Notice: Subject to any disclaimer, the term of this patent is extended or adjusted under 35 U.S.C. 154(b) by 246 days.

(21) Appl. No.: 13/085,255

(22) Filed: Apr. 12, 2011

(65) Prior Publication Data

US 2011/0249782 A1  Oct. 13, 2011

(30) Foreign Application Priority Data

Apr. 12, 2010  (GB) ................... 1006023.4

(51) Int. Cl.
*H04L 7/00* (2006.01)
(52) U.S. Cl.
USPC .......... 375/376; 375/316; 375/354; 375/371; 375/373; 375/374; 375/375; 375/355; 375/356; 375/357

(58) Field of Classification Search
USPC .............. 375/376, 316, 354, 371, 373, 374, 375/375, 355, 356, 357
See application file for complete search history.

(56) References Cited

U.S. PATENT DOCUMENTS

| | | | | |
|---|---|---|---|---|
| 6,028,462 | A * | 2/2000 | Kyles ............................ | 327/277 |
| 7,421,053 | B1 * | 9/2008 | Li et al. ......................... | 375/376 |
| 7,893,773 | B2 * | 2/2011 | Jensen et al. .................... | 331/17 |
| 8,138,840 | B2 * | 3/2012 | Ainspan et al. ................. | 331/1 A |
| 2004/0218919 | A1 * | 11/2004 | Hunsche et al. ................. | 398/27 |
| 2006/0280277 | A1 * | 12/2006 | Tashiro et al. ................. | 375/376 |
| 2007/0183552 | A1 * | 8/2007 | Sanders et al. ................. | 375/376 |
| 2007/0201595 | A1 * | 8/2007 | Stimple et al. ................. | 375/376 |

* cited by examiner

*Primary Examiner* — Siu Lee
(74) *Attorney, Agent, or Firm* — John R. Pessetto; W. James Brady; Frederick J. Telecky, Jr.

(57) ABSTRACT

A clock and data recovery circuit injects a noise waveform into the control loop to offset the data sampling point artificially in order to induce errors. The amplitude of the injected waveform can be varied to ascertain the effect on the bit error rate (BER) so as to be able to evaluate the temporal noise margin.

2 Claims, 3 Drawing Sheets

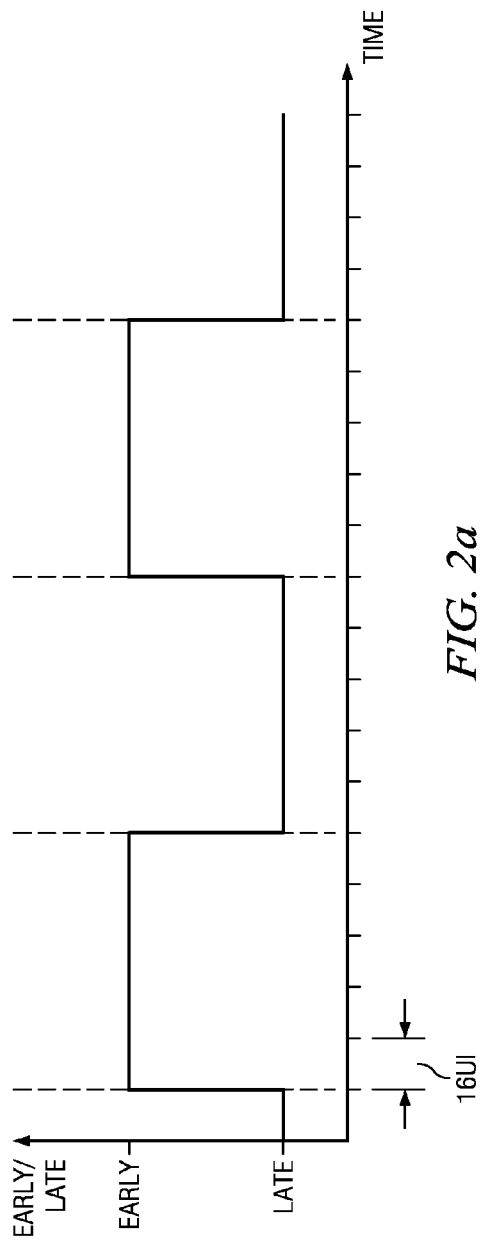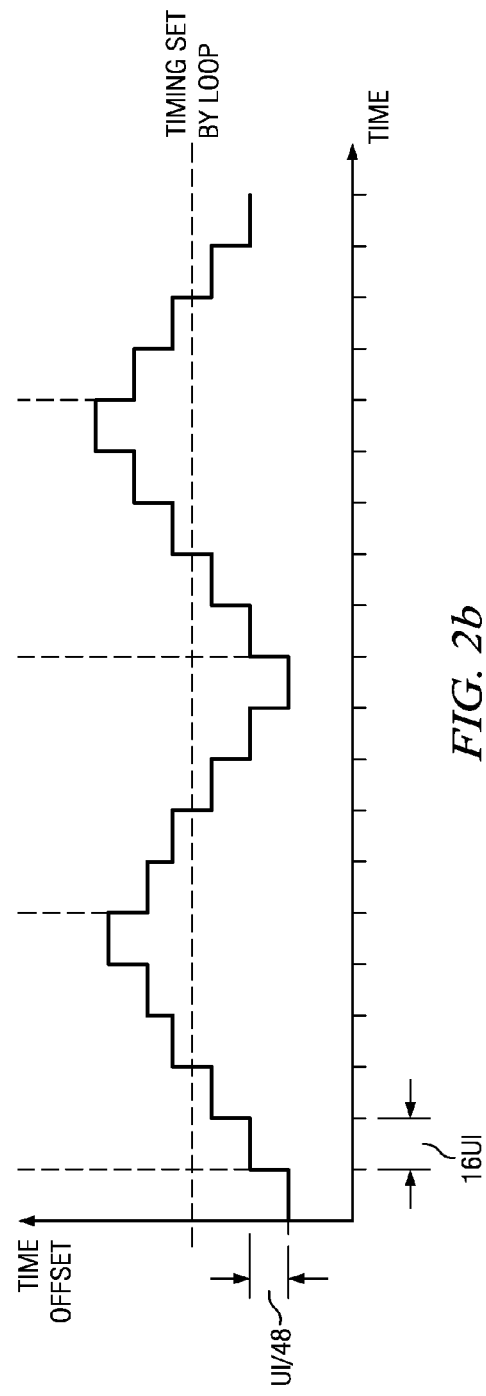

CLOCK RECOVERY

FIELD OF THE INVENTION

This application claims priority under 35 USC §119(e)(1) of European Application Number GB 1006023.4, filed on Apr. 12, 2010. The present invention relates to the measurements of bit error rates and phase error margin in receiver circuits, particularly those using a clock recovery loop.

BACKGROUND

Receiver circuits for sampling a received data waveform and in particular ones which include circuitry for setting the sampling point when jitter is present in the received waveform are known. Traditionally an analogue phase locked loop (PLL) circuit was used to control a local clock signal which is used to time the data samples, with the frequency of the local oscillator that is the source of that local clock signal being controlled by the feedback loop. In more modern implementations a fixed frequency oscillator is used and the fixed clock signal that it produces is passed through a phase interpolator to select dynamically an appropriate phase for the local clock signal that is then used to time the data sample. (A phase interpolator that may be used for clock recovery is described in GB patent 2 362 045.) In either case, in order to control the timing of the local clock signal, the circuit detects the difference in between phase of the local clock signal and phase of the data waveform. Numerous methods for detecting this phase difference are known in the art. One such arrangement which provides a SERDES application is described in GB patent Application 2 446 513.

A figure of merit for these receiver circuits is the bit error rate (BER) which is detected by transmitting to the receiver circuit a known pattern of data and then checking each bit to see if it is correct.

In the prior art for the purpose of such evaluation a more advanced method of a fixed static phase offset has been applied to the data sample position, which increases the data error rate since the sampling position is not ideal, but this method requires suspension of some aspect of the control loop, or if the application is to continue, significant duplication of the critical components.

SUMMARY OF THE INVENTION

By contrast and in accordance with an embodiment of the present invention, a control phase noise waveform is injected into the phase control loop in parallel to and with the loop operating as if in the mission mode, i.e. ordinary operation, so that the circuit remains in use in its application. The overhead of this implementation is very low, requiring a simple counter to inject a fixed number of phase advance commands followed by a fixed number of phase retard commands. So therefore the data sampling point scans back and forth across the ideal sampling point determined by the PLL loop. With the length of each sequence being programmable, this capability is adjustable in terms of amplitude and frequency of the phase margin applied.

The present invention provides data receiver comprising:
 a data waveform input,
 a local clock generator having an output of a local clock signal,
 a data sampler connected to the data waveform input and to sample a signal thereon at times defined by the local clock signal,
 a phase detector connected to compare the phase of the signal at the data waveform input and the phase of the local clock signal produced by the local clock generator to provide an early/late signal indicative of at least whether the phase of local clock signal is in advance of or is behind that of the signal on the data waveform input,
 a phase/frequency controller connected to receive the early/late signal and to provide a phase/frequency control signal to the local clock generator to advance the local clock signal when the phase detector indicates that the local clock signal is late and to retard the local clock signal when the phase detector indicates that the local clock signal is early, the phase detector and the phase/frequency controller thereby determining the timing of the local clock signal,
 the receiver further comprising a timing noise waveform generator connected to adjust the timing of the local clock signal, according to an offset waveform, from that determined by the phase detector and the phase/frequency controller.

The timing noise generator may be arranged to adjust the timing of the local clock signal in accordance with a waveform comprising a plurality of peaks. The timing noise generator may be arranged to adjust the timing of the local clock signal in accordance with a waveform comprising a plurality of peaks of equal height. The timing noise generator may has an amplitude input and maybe arranged to adjust the timing of the local clock signal in accordance with a waveform having an amplitude determined by an amplitude input.

The timing noise waveform generator may comprise a counter whose value determines an offset between the timing of the local clock signal and that determined by the phase detector and the phase/frequency controller.

The timing noise waveform generator may be connected to the phase/frequency controller to provide the phase/frequency controller with signals causing the phase/frequency controller to advance or retard the local clock signal.

The phase/frequency controller may be connected to provide the phase/frequency control signal in the form of a phase signal, wherein the timing noise waveform generator may be connected to provide a phase offset waveform signal, and wherein the receiver may comprise an adder connected to add the phase signal from the phase/frequency controller and the offset phase signal and to provide the resultant sum as the phase/frequency control signal to the local clock generator.

The present invention also provides a method of recovering a clock and data from an incoming signal comprising:
 tracking the incoming signal with a control loop to generate a clock signal,
 using that clock signal to recover data from the incoming signal, and
 injecting a control noise waveform into the control loop to offset the timing of the generated clock signal.

The control loop may comprise a phase interpolator for producing the clock signal. The phase interpolator may have a phase input, the value of which is determined by the control loop, and the method may comprise producing a phase offset waveform and adding that to the value determined by the control loop before it is applied to the phase interpolator.

The injecting may comprises applying phase advance and phase retard commands. The injecting may comprises applying a fixed number of phase advance commands followed by a fixed number of phase retard commands.

The waveform injected may comprises a plurality of peaks and those may be of equal height.

The present invention also proves a method of testing a transmission system comprising said method of recovering a clock and data from an incoming signal, and measuring the error rate in the recovered data, wherein the amplitude of the injected waveform is varied.

The present invention still further provides a clock and data recovery system comprising
  an input for receiving an incoming signal,
  a control loop arranged to track the incoming signal to generate a clock signal and to recover data from the incoming signal using that clock signal, and
  means for injecting a control noise waveform into the control loop to offset the timing of the generated clock signal.

The means for injecting the control noise waveform may comprise a counter.

The control loop may comprise a phase interpolator for producing the clock signal.

The phase interpolator may have a phase input, the value of which is determined by the control loop, the means for injecting maybe arranged to provide a phase offset waveform, and the system may comprise an adder connected to add the phase offset waveform to the phase value determined by the control loop before it is applied to the phase interpolator.

The means for injecting may be connected to apply advance and phase retard commands to the control loop.

The injecting means may be arranged to inject a fixed number of phase advance commands followed by a fixed number of phase retard commands.

The means for injecting maybe arranged to inject a control noise waveform that comprises a plurality of peaks. The means for injecting may be arranged to inject a control noise waveform that comprises a plurality of peaks of equal height. The means for injecting may have an amplitude input for controlling the amplitude of the control noise waveform injected.

The control loop may comprises:
  a local clock generator having an output of the clock signal,
  a data sampler connected to the incoming signal input and to sample the incoming signal times defined by the clock signal,
  a phase detector connected to compare the phase of the incoming signal and the phase of the clock signal produced by the local clock generator to provide an early/late signal indicative of at least whether the phase of clock signal is in advance of or is behind that of the incoming signal, and
  a phase/frequency controller connected to receive the early/late signal and to provide a phase/frequency control signal to the local clock generator to advance the clock signal when the phase detector indicates that the clock signal is late and to retard the clock signal when the phase detector indicates that the clock signal is early.

BRIEF DESCRIPTION OF THE DRAWINGS

FIG. 2a is a graph against time of the output of the timing noise waveform generator,
and
FIG. 2b is the form of the timing noise that injects.

EXAMPLES

Figure 1:
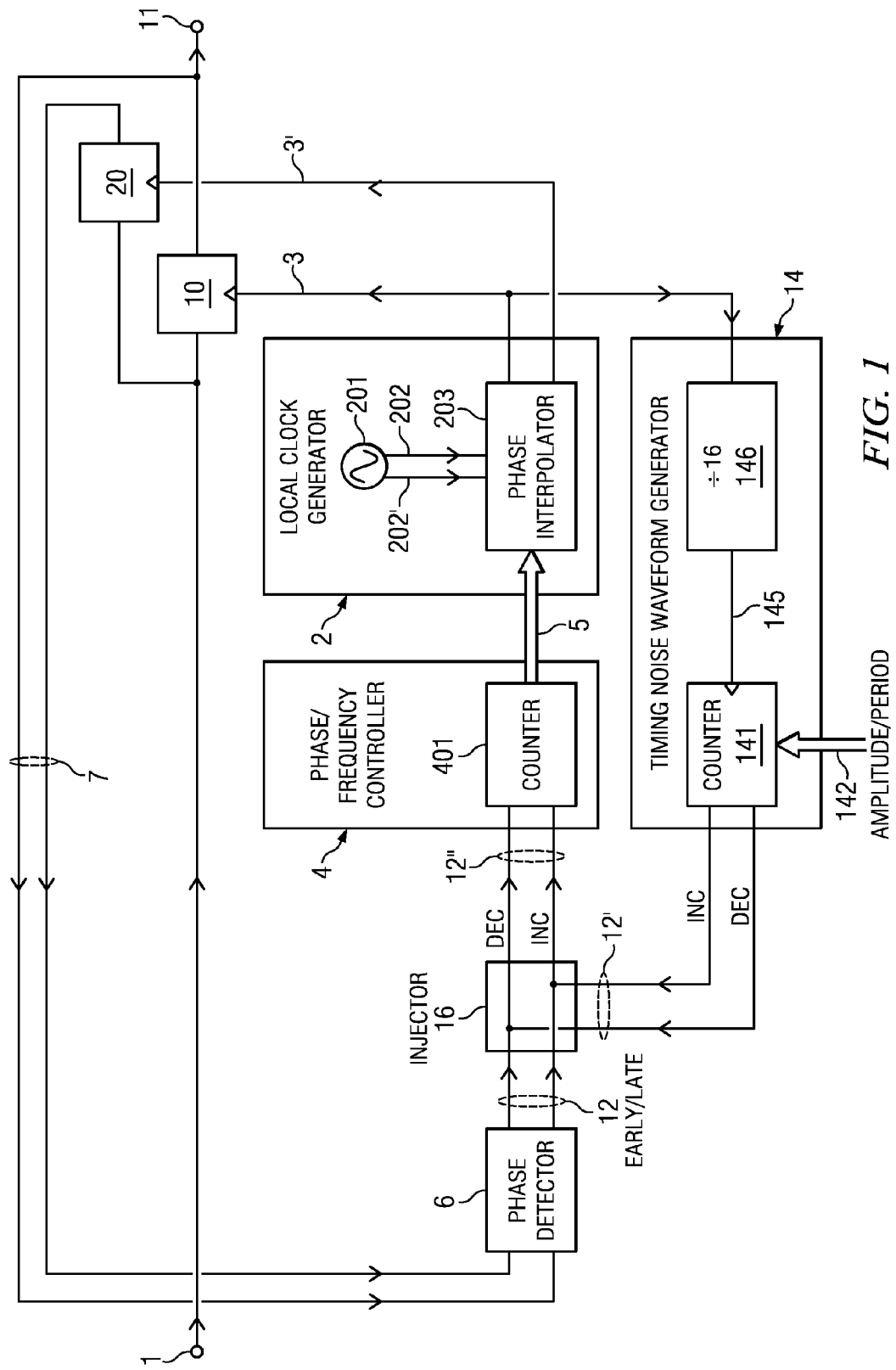
FIG. 1 is a block diagram of an example of the invention.

FIG. 1 is a block diagram of a particular example of a clock and data recovery circuit incorporating the invention. As is known, the purpose of such circuits is to synchronise a locally generated clock signal with an incoming data waveform containing some timing information. The circuit of FIG. 1 generally comprises, as is known for such circuits, an input 1 for the incoming data waveform, a local clock generator 2 that generates the local clock signal 3 and 3' (on the conductors in FIG. 1 that have been given the same reference numerals—this convention is followed herein for the other signals), a phase/frequency controller 4 is connected to provide a phase/frequency control signal 5 to local clock generator 2 to set the phase or frequency of the local oscillator signal 3, 3' produced and a phase detector 6 connected to receive a signal 7 containing some information indicating the phase of the incoming waveform.

A sampling latch 10 is provided which is connected to receive both the data waveform 1 and a first phase 3 of the local clock signal derived by the circuit and operates to sample the data waveform at times determined by the local clock signal, providing the digital sample as an output 11.

In the particular example of FIG. 1 the local clock generator 2 also produces a second phase 3' of the local clock signal that is in quadrature with the first phase and a second latch 20 is provided for the purposes (explained below)of the particular phase detector 6 of FIG. 1, which second latch samples the data waveform 1 in a times defined by that clock. As is known, if the first phase is sampling at the centre of each bit interval in the data waveform then the second phase samples at the boundary between bits, so if there is a change of data value between neighbouring bits then if the samples taken in succession by the first and second latches half of a bit interval (or unit interval—UI) apart are the same that indicates that the data sampling point for the data, i.e. the first phase, is too early, while if they are different it indicates that the sampling point is too late. Phase detector 6 receives the samples taken by latches 10 and 20 and calculates those indications. Over a succession of many UI, in this particular example over 128 UI (16 bytes×8 bits each) it averages those indications before providing an output 12 indicating whether the local clock signal 3 is early or late. In this particular example it makes 1 such indication every 128 bits. In some other examples the phase detector directly receives the local clock signal, but in the particular example of FIG. 1 the phase detector block 6 drawn does not need that because the function of comparing the phase of local clock signal 3 to the phase of the data waveform is performed by the latches 10 and 20 with the block 6 interpreting the results. The block 6 could therefore be redrawn to include latches 10 and 20.

There are many known solutions to detecting the phase difference between the local clock signal 3 and the incoming waveform. The arrangement shown in FIG. 1 works purely from digital samples of the data waveform. Others work from the analogue form of the incoming waveform, for example as in a traditional PLL. A mixture of the two would also be possible.

The signal 12 indicates whether the local oscillator signal is advanced or retarded with respect to the data waveform (i.e. is early or late). In some examples a third state may also be indicated that the two signals are in phase (at least to within some small margin), but in other examples the circuit always decide one way or the other. It would also possible for the signal 12 to indicate also the magnitude of the difference, but may solutions use only a simple indication of whether the local clock is ahead or behind.

The phase/frequency signal controller 4 is connected to receive the signal 12 and operates to output the oscillator phase signal 5, which signal sets the phase of the local clock signal produced by the local clock generator 2. The controller 4 operates to advance the phase, or increase the frequency, of the local oscillator signal 3 if that is late as indicated by the signal 12 and to retard the phase, or reduce the frequency, of the local oscillator signal if that is early. Setting the phase and frequency of an oscillator are in fact inseparable operations—advancing the phase increases the frequency instantaneously and retarding the phase instantaneously decreases the frequency. In other examples (such as a traditional PLL) the signal 5 control the frequency of the local oscillator, which is variable, not fixed, but as just explained changing the frequency changes the phase.

In the particular example of FIG. 1 the local clock generator 2 is of a known form comprising a fixed frequency local oscillator 201 that produces a fixed clock signal in sine wave quadrature form 202 and 202' and a phase interpolator 203 connected to receive those clock signals and to produce therefrom, by adding selected proportions thereof, the local clock signal 3 and the second quadrature phase thereof 3'.

Further, in the particular example of FIG. 1 phase/frequency controller 4 comprises a counter 401 holding a value for the phase to be selected by phase interpolator 203. In this example the counter has 48 possible values and the phase interpolator 203 produces in response thereto one of 48 evenly spaced clock phases. The early/late signal 12 produced by the phase detector 6 is produced in a suitable form to be connected to the counter 401 as increment and decrement command inputs; (which being which depends on whether increasing the value of the counter advances or retards the phase of the local clock signal 3, which an arbitrary choice). The role of the injector 16 is explained further below but basically the early late signal 12 passes through it to the counter.

A common additional component in traditional phased locked loops is a loop filter, connected to filter the feedback signal in the control loop and this may be used in the present invention. Generally a phased locked loop is designed to follow low frequency variations, jitter, in the timing of the incoming waveform 1, over several cycles (or bit periods) or typically over many hundreds or thousands of cycles. More rapid variations would not be distinguishable from other forms of noise so it is not desirable for the PLL to react to those, so the loop filter is usually a low pass filter. The loop filter may be implicit in the implementation of the main components of the PLL or be a separate circuit element. The digital control loop of the particular example of FIG. 1 does not need an explicit loop filter because the averaging, described above, of its phase detector performs that function.

The present invention provides a method of testing whether the data samples taken by the circuit (i.e. those at latch 10) are susceptible to data errors and to what extent.

For that a timing waveform generator 14 is provided in a clock and data recovery circuit, for example that of FIG. 1, which provides additional early/late signals 12', which are superimposed on those 12 from the phase detector 6. An injector 16 is connected to do that, receiving both sets of early/late signals 12, 12' and applying the resultant 12'' to the phase/frequency detector. (As discussed late below injection may take place at other places in the loop.) In the particular example of FIG. 1 the early/late signals 12 and 12' are in the form of pulses and those pulses from the different sources of the phase detector 6 and the timing waveform generator 14 are timed not to occur at the same time. As shown in FIG. 1, the injector 16 is provided in the form of respective nodes shorting the respective early and late signals from the two sources together, which nodes are each then connected to one of the increment and decrement inputs of the counter 401.

FIG. 1 shows in the details of the box 14 an example of the timing noise waveform generator 14. A counter 141 is loaded with a control word 142, having a value N, which indicates both the amplitude an period of the injected noise waveform as will become apparent. This counter counts at each tick of a clock signal 145 derived from the local clock signal 3 by a divide by sixteen counter 146. The count proceeds first up to N and then down again. When it reaches N it generates signal 12' as an early signal and when it reaches 0 it generates that in the form of a late signal. This pattern is then followed repeatedly. (The divide by sixteen is selected by the practicality of the speed of operation of this part of the circuit; faster noise waveforms may be injected if fast implementing circuitry is provided.)

FIG. 2a shows the output of the counter 141 which is a series of N indications of early followed by a series on N indications of late, with that pattern being repeated.

FIG. 2b shows on the same time axis the magnitude of noise injected into the control loop. The vertical axis of this graph is the temporal displacement of the data sampling points (the sampling performed by latch 10) from its ideal position determined by the loop. The shape of the waveform of this injected wave is a triangular wave, which has a peak to peak height of the count N times the timing offset provided by a count of one which is 1/48 UI, and which has period of 2N·16 UI. The frequency of this injected noise waveform is higher than that to which the loop responds so the loop does not track these variations. (The period of the noise waveform is 2N·16 UI with N typically being up to 5 or 6—so the longest period then being up to about 192 UI, while the phase detector can only change the phase one increment every 128 UI.) Note that the averaging of the phase detector 16 does not filter out the artificial timing noise because the injector 16 injects it after that but before the local clock generator 2.

Note also that while apparently the injected variations in timing of the data sampling point are to one side of the ideal sampling point (if one assumes that count of counter 141 started at zero or N) the loop will respond to the DC level in the injected noise waveform and therefore the loop will adjust so that on average the timing of the data sampling is at the ideal point, as indicated by the dashed horizontal line in FIG. 2a, and the excursions provided by the timing waveform generator 14 are to both sides of the ideal point (after the loop has settled down).

This invention is useful to the user of the clock and data recovery circuit in at least the following way. When setting up a data transmission system it is useful to know the BER that the data transmitted will be subjected to; that figure may, for example, be guaranteed to the customer. The BER is measured by transmitting known patterns of data, receiving them, and then comparing the recovered data to the known pattern. The required BERs are often very low. The installer of the equipment will want to make changes to the controllable parameters of the transmission system based on the measured BER but will have to wait a very long time (days or weeks sometimes) before the results are known, which is impractical. However by using the invention to inject temporal displacements from the ideal timing of the data sampling errors can be induced. Note that small displacements induce no errors but larger ones do. So it is the peaks of injected noise waveform which induce more errors.

The installer uses the invention to inject larger and larger amplitudes of noise (in the Example of FIG. 1 by changing the control word 142) while transmitting test data to see when significant error rates occur, which enables the installer to evaluate the temporal noise margin of the receiver circuit. Adjustments to the parameters are made to see if that margin can be improved, since it is likely that with a larger margin the BER will be lower. Once the parameters have been decided upon an extended test of the transmission system without injected noise can be undertaken. An advantage of the invention is that the clock and data recovery loop continues to operate normally while the noise injection testing proceeds, so it provides a very representative test of the live transmission system.

In other examples of the timing noise waveform generator 14 the control of the magnitude of the injected noise waveform and its period are controlled by separate control words. However the particular example of FIG. 1 requires only a small amount of circuitry.

Figure 3:
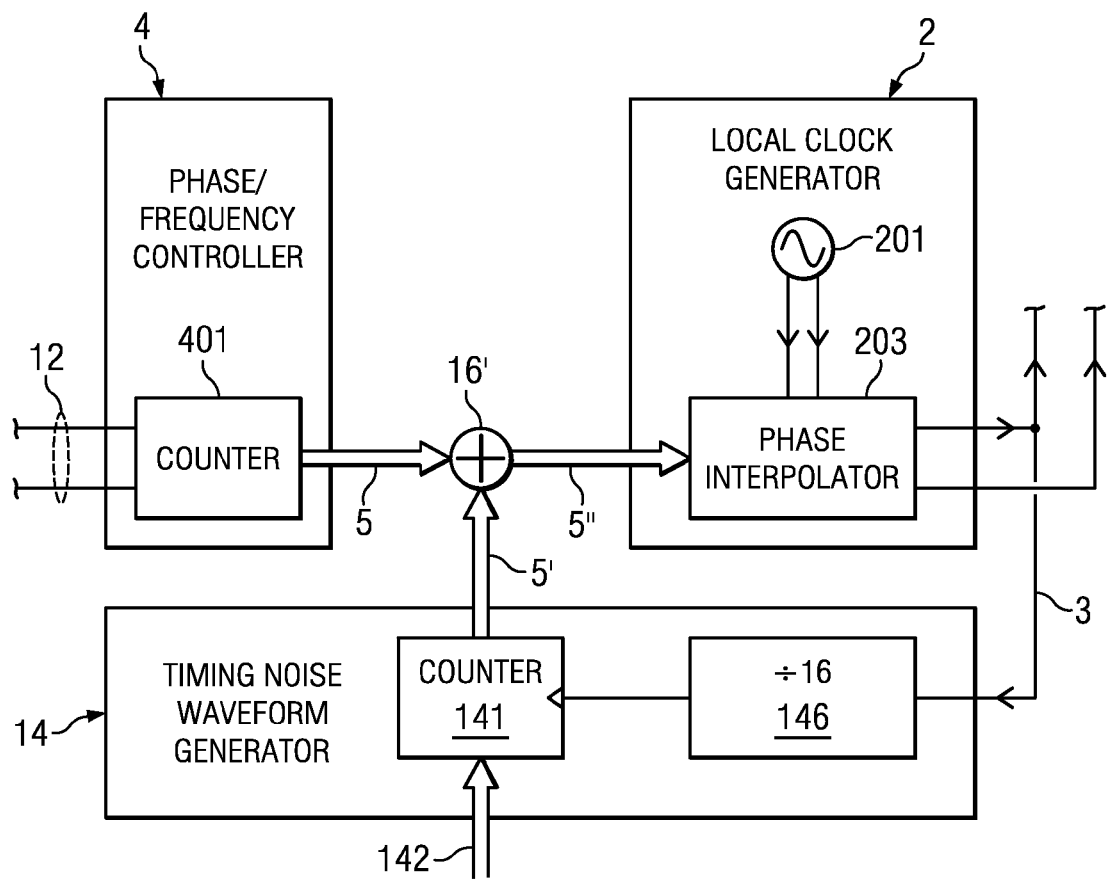
FIG. 3 is a block diagram of an alternative example for injecting the waveform.

In the above examples the noise waveform is injected between the phase detector and the phase/frequency controller 4. Other positions are possible however. For example in the example of FIG. 1, a timing noise waveform could be injected between the phase/frequency controller 4 and the local clock generator 2. FIG. 3 shows the arrangement in one example (the Figure omitting the other parts of the loop). The output of the phase/frequency controller is as before in the form of a phase value for the local clock signal so timing noise waveform generator 14 provides an offset noise waveform also in the form of a phase value. Counter 141 of the waveform generator 141 in its form described earlier above already provides such a value namely the value in that counter (and this takes the series of values shown in FIG. 2b) so that is output instead—at 5'. The outputs 5 and 5' of the counters 401 and 141 are added by adder 16' to form phase value 5" which is applied to the phase interpolator 203. The adder 16" superposes (and therefore injects) the generated noise waveform 5' on the ideal phase 5 for the data sampling.

In the above the examples the phase/frequency noise injected is periodic. That is preferable for two reasons. First it is simple to provide in the circuit and second each peak has the same amplitude—as explained above the peaks of phase offset are mainly responsible for the errors detected, so having the peaks in the injected noise waveform having the same height means that each peak produces the same BER and therefore one can quantify the phase noise margin at a particular bit error rate.

However, the invention is not limited to injecting the phase/frequency noise signal in periodic form. As noted above that is preferable for several reasons but non-periodic waveforms could be used. With these it would still be an advantage to having the largest peaks being from time to time of the same size, for the reason noted above. Thus in that case the injected noise waveform includes a plurality of peaks having the same magnitude at the peak. More general waveforms could be used but would, in general, lead to more complex to interpret bit error rate results.

The invention claimed is:

1. 1 A data receiver comprising:
a data waveform input,
a local clock generator having an output of a local clock signal,
a data sampler connected to the data waveform input and to sample a signal thereon at times defined by the local clock signal,
a phase detector connected to compare a phase of the signal at the data waveform input and a phase of the local clock signal produced by the local clock generator to provide an early/late signal indicative of at least whether the phase of the local clock signal is in advance of or is behind that of the phase of the signal on the data waveform input,
a phase/frequency controller connected to receive the early/late signal and to provide a phase/frequency control signal to the local clock generator to advance the local clock signal when the phase detector indicates that the local clock signal is late and to retard the local clock signal when the phase detector indicates that the local clock signal is early, the phase detector and the phase/frequency controller thereby determining a timing of the local clock signal,
the data receiver further comprising a timing noise waveform generator connected to adjust the timing of the local clock signal, according to an offset waveform, from that determined by the phase detector and the phase/frequency controller;
wherein the timing noise generator has an amplitude input and is arranged to adjust the timing of the local clock signal in accordance with a waveform having an amplitude determined by the amplitude input.

2. A data receiver comprising:
a data waveform input,
a local clock generator having an output of a local clock signal,
a data sampler connected to the data waveform input and to sample a signal thereon at times defined by the local clock signal,
a phase detector connected to compare a phase of the signal at the data waveform input and a phase of the local clock signal produced by the local clock generator to provide an early/late signal indicative of at least whether the phase of the local clock signal is in advance of or is behind that of the phase of the signal on the data waveform input,
a phase/frequency controller connected to receive the early/late signal and to provide a phase/frequency control signal to the local clock generator to advance the local clock signal when the phase detector indicates that the local clock signal is late and to retard the local clock signal when the phase detector indicates that the local clock signal is early, the phase detector and the phase/frequency controller thereby determining a timing of the local clock signal,
the data receiver further comprising a timing noise waveform generator connected to adjust the timing of the local clock signal, according to an offset waveform, from that determined by the phase detector and the phase/frequency controller;
wherein the timing noise waveform generator comprises a counter whose value determines an offset between the timing of the local clock signal and that determined by the phase detector and the phase/frequency controller.

* * * * *